United States Patent [19]

Lecornet

[11] 4,255,690
[45] Mar. 10, 1981

[54] CATHODE HEATING APPARATUS FOR AN ELECTRONIC POWER TUBE

[75] Inventor: Jean-Claude Lecornet, Paris, France

[73] Assignee: Thomson-CSF, Paris, France

[21] Appl. No.: 46,450

[22] Filed: Jun. 7, 1979

[30] Foreign Application Priority Data

Jun. 13, 1978 [FR] France .................. 78 17620

[51] Int. Cl.³ ............. H05B 39/04; H05B 41/06
[52] U.S. Cl. .................. 315/106; 328/270; 315/105
[58] Field of Search ........... 315/107, 106, 105, 102, 315/94, 101, 291, 36 P; 328/27 P

[56] References Cited

U.S. PATENT DOCUMENTS 3,568,004  3/1971  Parker .................. 315/102

Primary Examiner—Alfred E. Smith
Assistant Examiner—Thomas P. O'Hare
Attorney, Agent, or Firm—Roland Plottel

[57] ABSTRACT

An apparatus for heating the cathode of an electronic power tube, having a supply for delivering a heating current to the cathode, an interrupter circuit for periodically interrupting the flow of heating current to the cathode, and controls for controlling the duration of these periodic interruptions and for regulating the net amount of heating current. To achieve this, the controls include a voltage control that varies in such a way so as to bring the heating current from a value of O to Io (where Io is the correct heating current at which the tube will be in a pre-heated condition) during a first, predetermined time period, and then from a current Io to a current Im (where Im is the optimum value for the heating current when the tube is normally operating), during a second predetermined time period.

5 Claims, 3 Drawing Figures

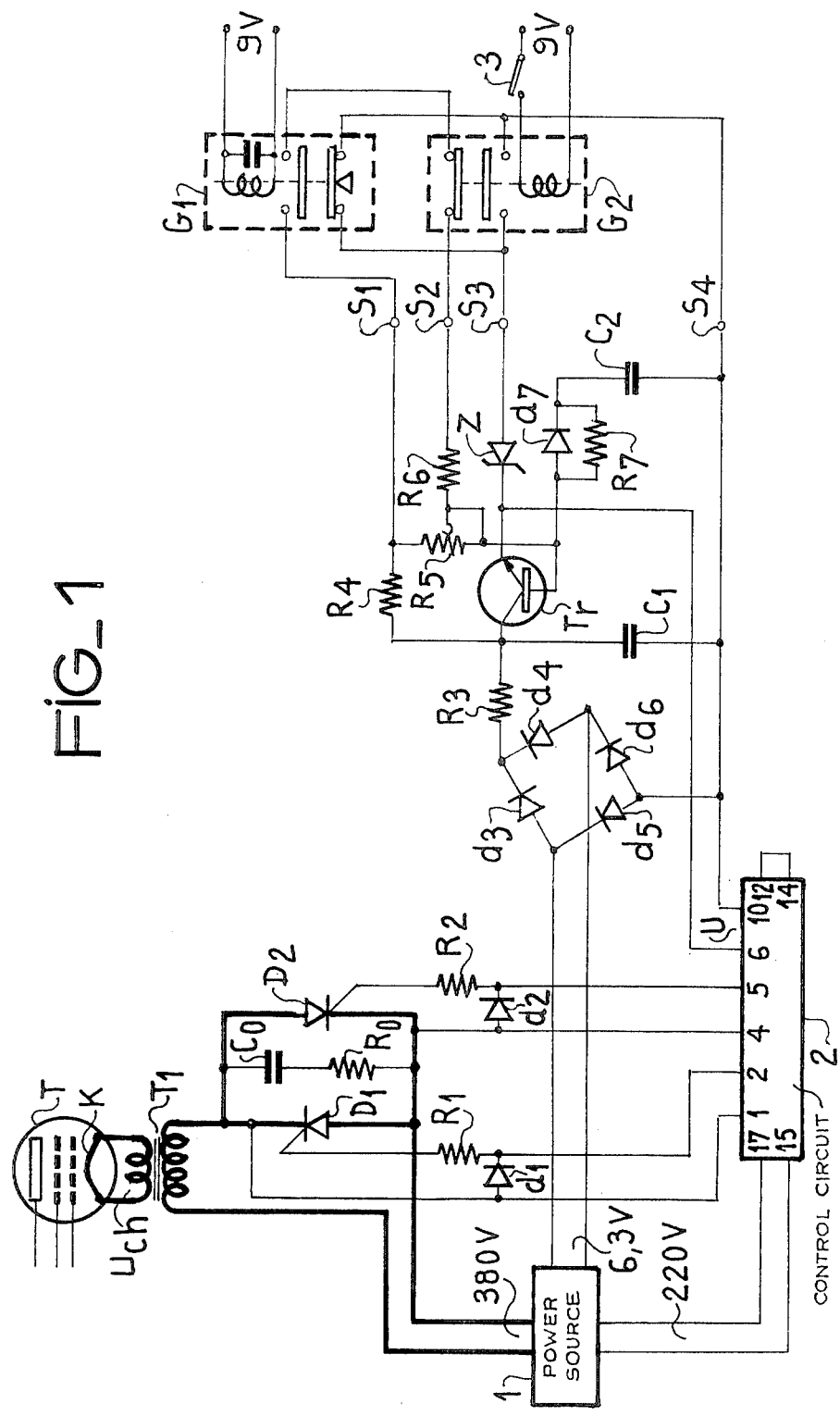

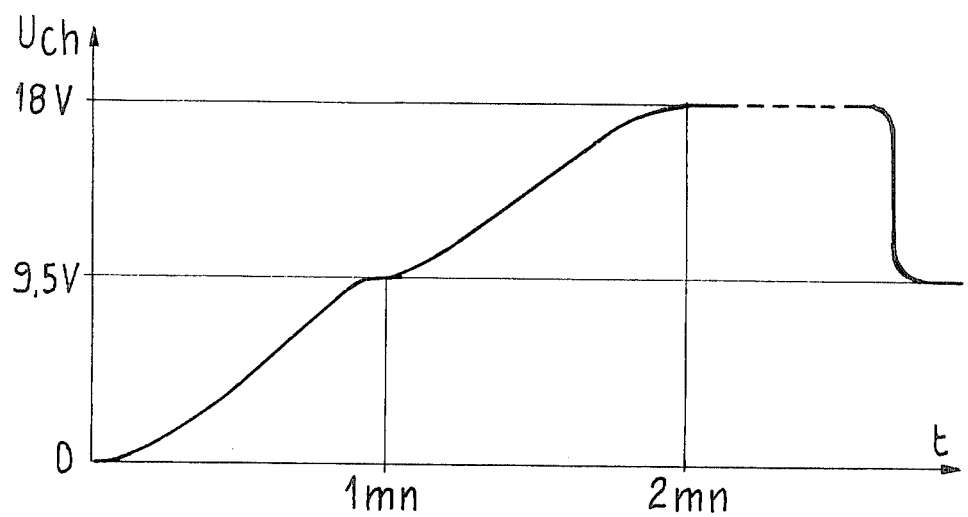
FIG_2
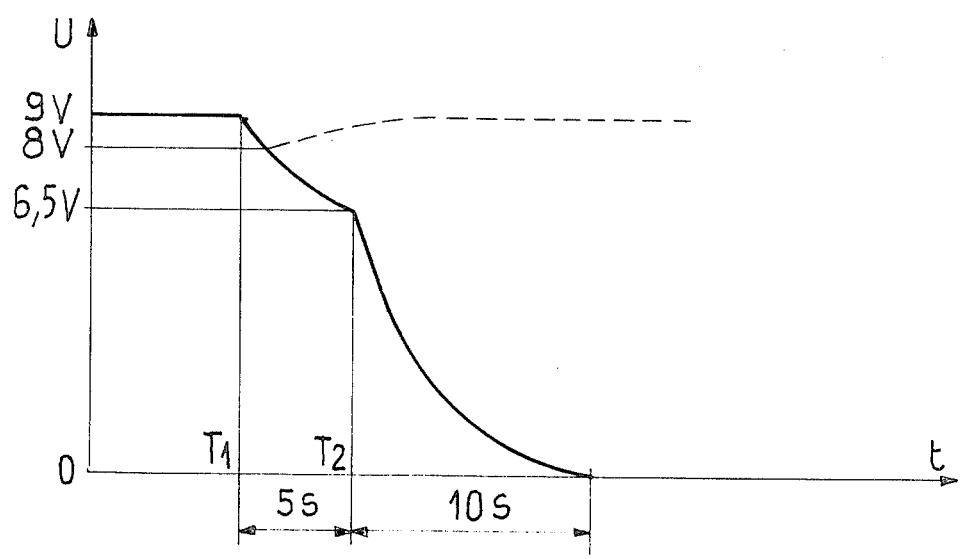
FIG_3

CATHODE HEATING APPARATUS FOR AN ELECTRONIC POWER TUBE

FIELD OF THE INVENTION

The present invention relates to electronic power tubes, and particularly to circuits for controlling the cathode heater.

The present invention relates to an apparatus for heating the cathode in an electronic power tube. It includes a control of the feeding of heating current to the cathode. Particularly it permits a predetermined increase in this current to an amplitude of Io for a preheating of the tube, and then it brings this current to a value Im, for a normal functioning of the tube. Im is the proper amount of heating current when the cathode attains a temperature for normal operation of the tube; Io is the proper amount of current, less than Im, when the tube is pre-heated.

This normal functioning mentioned above represents the operation of the tube at a nominal value of the heating voltage during operation that are defined in the characteristics of the tube by the tube's manufacturer.

DESCRIPTION OF THE PRIOR ART

In a prior art, apparatus is known in which the cathode heating current is not brought immediately to its maximum current, a current that corresponds to the normal functioning of the tube in its steady state condition. In the apparatus of the prior art, the cathode heating current increases in steps. This is due to several resistances that are progressively short-circuited so that the temperature of the cathode may be increased. This process avoids warping of cathode and possible resulting contact with other electrodes that would put the tube out of service. However, operation through successive steps requires large, and heavy electro-mechanical apparatus that is highly prone to breakdown. Due to its large size, the electro-mechanical apparatus is difficult to put into service if it has not already been checked out at the time of manufacture; however problems may also arise as a result of actual use or operation. Moreover, as the level is changed, a spike of heating current is produced. In order to remain below the value which must not be exceeded (as defined in the tube's specifications), either a special heating transformer is needed or a large number of levels must be used.

An object of present invention is to avoid, as much as possible, the drawbacks of the prior art apparatus, and provide a novel apparatus for providing heating current to the cathode of a power tube that is simple, compact, efficacious, reliable, inexpensive, and easy to manufacture and service.

According to the invention, there is provided, an apparatus for heating a cathode of an electronic power tube having a direct heating cathode. The apparatus includes a source for delivering a heating current to the cathode; and an interrupter circuit for interrupting said delivery of current to the cathode. A control coupled to the interrupter circuit controls the interruptions by the interrupter circuit, with a predetermined frequency, and with a duration of aperture or passing of current which varies as a function of time which has elapsed, for bringing said heating current from O to Io, which is the effective value of said heating current for which said tube is in a pre-heating condition, and for then bringing said heating current from Io to Im which is the effective value of said heating current when said tube is in normal operating condition.

BRIEF DESCRIPTION OF THE DRAWING

FIG. 1 is a schematic circuit drawing showing the invention.

FIGS. 2 and 3 are graphs showing certain signals of the circuit of FIG. 1.

DETAILED DESCRIPTION

FIG. 1 shows a feeding circuit for a cathode, K, of a power tetrode, T, for example a 300 kw effective power of high-frequency carrier, manufactured by the Thomson-CSF Company, Type no. TH537. The heater 2 is a direct heater. Energy for heating is provided to the cathode K through a transformer, T1., provided by an AC source of voltage, 1. Source 1 continuously furnishes three different voltages:—380 volts, 200 volts, and 6.3 volts all at the same frequency, F, 50 Hz.

In FIG. 1, the power circuit which joins the output of the 380 volts from the source, 1 to the cathode K, is shown drawn in heavy lines. The power circuit includes, in addition to transformer, T1., a switching circuit positioned between one of the two output terminals of the 380 volt source and the primary terminals of transformer, T1. The switching circuit includes two thyristors, D1 and D2, mounted in parallel, but in opposite directions. Also mounted in parallel with the thyristors, D1 and D2, between their anodes and cathodes, is a series connection of a resistor, Ro and a capacitor, Co.

Thyristors D1 and D2 are controlled by a thyristor control circuit, 2. This circuit may be of the type made by the Silec Company, Type no. L1. Terminals of control circuits 2 are shown in the box, 2, with legends 1, 2, 4, 5, 6, 10, 12, 14, 15, and 17. Terminals 1, 2, 4, and 5 are connected to the switching circuit as follows. Terminal 1 is connected to the anode of a diode, d1, and to the cathode of thyristor D1. Terminal 2 is connected to a cathode of diode d1 and thorugh a resistor, R1, to a control electrode of thyristor D1. Terminal 4 is connected to an anode of a diode d2 and to a cathode of thyristor D2. Terminal 5 is connected to a cathode of diode d2, and through a resistor, R2, to a control electrode of thyristor D2.

The control circuit, 2, receives between terminals 6 and 10 a control voltage, U, the source of which will be described below. Circuit 2 receives between terminals 15 and 17 a synchronizing voltage which is the 220 volts coming from power source 1. If the Silec Type L1 circuit is used, terminals 12 and 14 in that circuit should be short-circuited or connected together as is shown in FIG. 1.

The angle of opening, of thyristors D1 and D2, and thus the effective heating current to the tube, T1, is controlled by a signal which comes respectively from terminals 1, 2, and 4, 5 of control circuit 2. These control signals are trains of pulses made up of pulses 13 μs(microseconds) in duration, 5 volts in amplitude and occurring every 150 μs. The pulse trains occur at the frequency of the alternating current provided from the source, 1, i.e., at the frequency F of 50 Hz. The duration of the pulse train is a linear function of the amplitude of the control voltage, U, that is applied between terminals 6 and 10 of the thyristor control circuit 2.

The heating apparatus of FIG. 1 is designed to permit a gradual warming or heating of the tube T when it is initially turned on. This heating takes place gradually and continuously, not in steps, as in the prior art. This is different from the levels of certain prior art arrangements in which resistances in series in the power circuit that lead the current to the cathode are short-circuited one after the other as the temperature of the cathode rises. The gradual heating in this application must also have a time profile adapted to the tube to be heated. That is to say that during the heating by current provided to the cathode of the tube, there must be no risk of damaging the tube.

Furthermore, the heating circuit of FIG. 1 is designed to furnish a heating current to the cathode to bring about a "pre-heating" of the cathode. In case of a stop or pause between two utilizations of the tube, this pre-heating allows the tube to rapidly start again its normal operation, and eventually (if the voltage of the pre-heating is sufficiently small) provides a possibility of stopping the system for recooling the tube.

The heating circuit of FIG. 1 is also designed to provide a very rapid restarting and a normal use or operation of the tube in case of an accidental stop of short duration of the feeding voltage. In the case of the example under consideration, such functioning is envisioned for accidental stops of less than five seconds.

These results are obtained due to a voltage control circuit which will be described below. This circuit furnishes the command voltage, U, to the thyristor control circuit 2, which regulates the average amount of heating current to the cathode of the tube.

The voltage control circuit includes a rectifier of four diodes, d3–d6, which rectifies the two alternations of the 6.3 volts provided by the power voltage supply, 1. The diode rectifier has positive and negative output terminals which are respectively connected to a first terminal of a resistor, R3, for example of 100 ohms, and to terminal 10 of thyristor control circuit 2.

The second terminal of resistor R3 is connected to a collector of a NPN transistor, Tr; to a first terminal of a resistor, R4, for example of 470 ohms; and through a capacitor, C1, of for example 1000 micro-farads, to the terminal 10 of the circuit 2.

Transistor Tr plays the role of a ballast transistor. Its emitter is connected to terminal 6 of circuit 2; and to a cathode of a Zener diode, Z, whose Zener breakdown voltage, for example, is 5.8 volts. An anode of the Zener is connected to a terminal, S3. This terminal, S3, is one of four imaginary terminals, S1–S4, shown in FIG. 1 in order to make the explanation of the circuit easier. A base of transistor Tr is connected to a first terminal of a variable resistor, R5, for example of 10,000 ohms and to a wiper of this resistor. Another extremity of the variable resistor R5 is connected to a second terminal of resistor R4 and to terminal S1. The base of transistor Tr is also connected to an anode of a diode, d7, whose cathode is connected through a capacitor, Ct, for example, of 1000 micro-farads, to a terminal 10 of the thyristor control circuit 2. A resistor, R7, for example of 470 ohms, is connected in parallel with the diode d7.

A resistor, R6, for example of 1000 ohms, is connected between the wiper or movable contact of the variable resistor R5 and terminal S2. Terminal S4 is directly connected to terminal 10 on the thyristor control circuit 2.

Two relays, G1 and G2, both of two contacts, are shown in FIG. 1 in their normal or unactivated position. Relay G1 is a time-delay relay which has a fixed time delay of one minute after application of a control signal to its winding and its operation, and a time delay of five seconds to release after voltage is removed from the winding. Relay G2 is a non-time-delay relay. The DC voltage, for example of 9 volts, provided by the rectifiers d3–d6, is applied directly to the terminals of the winding of relay G1, and also through switch, 3, to the terminals of the winding of relay G2.

The purpose of switch 3 is to choose between a heating of the cathode K for a normal operation of the tube T (open position); and a pre-heating mode, as described above (closed position of the switch). The operation of the switch 3 will appear below.

Beginning at the moment when the source of potential, 1, is turned on and delivers a potential at its output, and whatever the position of the switch 3, the terminals S3 and S4 are connected together for a period of one minute due to the one-minute time delay of the relay G1. There is, however, no connection between terminals S1 and S2. The result is that the capacitor C2 begins charging through resistors R3, R4, and R5 to the Zener voltage of Zener diode Z. This charging proceeds with an approximate time constant equal to R5 C2 since R3 and R4 are negligible in comparison to R5. This brings about an increase of the voltage, U, applied between terminals 6 and 10 of the thyristor control circuit 2, with a time constant approximately equal to R5 C2 from 0 volts to the Zener voltage, in the above example, 5.8 volts, and in the time $t=0$ and $t=$ one minute. The result is a growth of the heating voltage, Uch of the cathode of the tube T which has the general shape of curve shown in FIG. 2 between the times $t=0$ and $t=1$ minute.

At time $t=1$ minute; i.e., one minute after the source 1 began to deliver voltage at its output, the contact mechanism of the relay G1 is actuated. If Switch 3 is closed, with the result that relay G2 is in the operated position, then the actuation of the contact mechanism in relay G1 is without any effect on changes of voltage U, which remains constant at the Zener potential of the Zener diode Z.

If, at time $t=1$ minute, switch 3 is open (and thus relay G2 is in its normal or nonoperated position) the relay G1 on actuation of the contact mechanism breaks the direct connection between terminals S3 and S4 and creates a conducting path between terminals S1 and S2. The potential on the terminals of control circuit 2 is no longer thus limited by the Zener potential of diode Z; but, at the fall of potential in the transistor Tr and in the diode d7, increases to a value of the continuous potential provided by the rectifier circuit made up of the four diodes d3–d6. The growth of the potential, U, is thus brought about with a time constant approximately equal to C2 Rp, where Rp is the value of the resistance equivalent to the resistances R5 and R6 arranged in parallel due to the direct contact between the terminals S1 and S2. This results in a variation of the heating voltage, Uch, which has the general appearance of what is shown in FIG. 2 between the times $t=1$ minute and $t=2$ minutes: a growth from 9.5 to 18 volts between the times $t=1$ minute and $t=2$ minutes.

The amplitudes attained at the beginning of time $t=1$ minute and $t=2$ minutes by the voltage U, and thus by the voltage Uch in FIG. 2 are adjustable. To achieve this, it is enough to change the Zener diode.

The potential, U, as noted above, controls the heating of the cathode of tube T. This control is done in two steps, beginning at the moment when the apparatus shown in FIG. 1 is turned on. During the first step, from $t=0$ to $t=1$ minute on FIG. 2, and with a slope (function of the product R5 C2) and a final control voltage (here, for example, of 5.8 volts determined by the Zener diode Z) that are chosen as functions of the tube, and particularly of the desirable value Io of the current of pre-heating to be attained, the heating voltage Uch, brings the cathode of the tube T to a pre-heating temperature of, for example, 800° to 1000° C. with a maximal speed, bearing in mind the variations of temperature that can be used without damaging the cathode. It is to be noted that this pre-heating has been chosen in a manner to prevent the system from cooling the tube.

During the second step (from t=1 minute to t=2 minutes in FIG. 2), and with a predetermined slope (a function of C2 Rp, i.e., C2 R5 R6), and a given control voltage (determined by the alternating voltage provided by the voltage source to the rectifier circuit d3–d6; about 9 volts in the present example), the voltage U results in a heating voltage Uch which controls a desired value Im of the heating current of the cathode corresponding to a normal functioning of the tube.

FIG. 2 also shows a variation of the heating voltage, Uch, when the tube T is normally functioning and the switch 3 (FIG. 1) is closed. When the switch is closed, terminals S1 and S2 are no longer connected together, since the terminals S3 and S4 are again connected together as in the first step of heating, which has been discussed above (between t=0 and t=1 minute in FIG. 2). There is thus a discharge of capacitor C2 until a value approximately equal to the Zener potential of diode Z is reached, which results in a return to a pre-heating condition of the cathode of tube T.

FIG. 3 shows how the control voltage, U, varies when the tube T is in normal operation (relay G1 is operated with its contacts closed, and relay G2 is unoperated, or normal; and correct voltages are applied by source 1), and there suddenly occurred at time t1 a failure of the voltage provided by source 1.

Due to the time delay of five seconds after the removal of potential at relay G1 and the contact mechanism being released, the contacts S1 and S2 remain connected for a time t1–t2, where t2=t1+5 seconds. During this interval of time, the capacitor C2 discharges with a time constant substantially equal to C2 R7. The potential, U, falls, but relatively slowly during this time interval. If the potential provided by source 1 returned to normal during the interval of time t1–t2, for example at a time when the command voltage had a value only more than 6.5 volts, this potential U will go up again as indicated by the curve of the broken line in FIG. 3, and the heating potential, Uch, will go back up practically instantly to an amplitude allowing an immediate return to normal operation. It follows that the normal functioning of the tube returns very quickly without having to go through the first heating step corresponding to what is shown in FIG. 2 on the part of the curve between t=0 and t=1 minute. Indeed, this is only possible because of the thermal inertia presented by the tube T: in the absence of the heating potential, for at least five seconds, the cathode of the tube T still remains at that level, at a temperature greater than its pre-heating temperature.

The invention is not limited to the example described. For example, different other circuits may be envisioned to provide the power thyristor command signals. In particular, a single power thyristor could be used in place of the two thyristors of FIG. 1; but then the heating current is only applied during one alternation of the two of the 380-volt potential delivered by source 1. When there are several tubes to be heated, it is possible to utilize the same voltage U (FIG. 1) for controlling the heating of these tubes. Moreover, the relays G1 and G2 may be replaced by electronic devices.

Moreover, the heating voltage that is being passed and that is being cut may go through more than two successive levels.

I claim:

1. An apparatus for heating a cathode of an electronic power tube having a direct heated cathode, said apparatus comprising: feeding means for feeding a heating current to said cathode; interrupter circuit means for interrupting said feeding of a current to said cathode; and control means coupled to said interrupter circuit means for controlling the interruptions by said interrupter circuit, with a predetermined frequency, and with a duration of passing of current which varies as a function of time which has elapsed, for bringing said heating current from O to Io, which is the effective value of said heating current for which said tube is in a pre-heating condition, and for then bringing said heating current from Io to Im which is the effective value of said heating current when said tube is in its normal operating condition, Im being greater than Io.

2. An apparatus for heating a cathode according to claim 1, wherein said feeding means provides an alternating current with a frequency F; wherein the interrupter circuit means includes m thyristors, m being a positive integer, each having a control electrode, and each being connected between said cathode and said feeding means; wherein said control means furnish at frequency F deblocking signals to the control electrodes of the thyristors, and include therefore a thyristor control circuit having its outputs coupled to the electrodes of said m thyristors, and a voltage control circuit providing to said thyristor control circuit a control voltage, U, whose amplitude determines the value of the said heating current and varies from 0 to Uo and from Uo to Um with predetermined slopes, Uo and Um being the values of said control voltage which determine the values Io and Im of said heating current; and wherein said feeding means are coupled to said thyristor control circuits to provide a synchronization signal to said thyristor control circuit.

3. A cathode heating apparatus according to claim 2 in which said voltage control circuit has first and second time constant circuits to provide said voltage U and a time delay switch to connect to the thyristor control circuit one or the other of said time-constant circuits.

4. A cathode heating apparatus according to claim 3, wherein, when said cathode is to be first heated, said time delay switch connects said first time constant circuit, and then after a predetermined time T, connects said second time constant circuit in place of the first.

5. A cathode heating apparatus according to claim 4, wherein said time delay switch is coupled to said feeding means, and when said feeding means during its normal operation is suddenly cut off, said time delay switch then disconnects said second time constant circuit only after a predetermined time T' after said feeding means cuts off.

* * * * *